(12) United States Patent
Qin

(10) Patent No.: US 8,302,841 B2
(45) Date of Patent: Nov. 6, 2012

(54) WIRE PAYOUT MEASUREMENT AND CALIBRATION TECHNIQUES FOR A WIRE BONDING MACHINE

(75) Inventor: Ivy Wei Qin, Lansdale, PA (US)

(73) Assignee: Kulicke and Soffa Industries, Fort Washington, PA (US)

( * ) Notice: Subject to any disclaimer, the term of this patent is extended or adjusted under 35 U.S.C. 154(b) by 0 days.

(21) Appl. No.: 12/921,663

(22) PCT Filed: Jan. 22, 2009

(86) PCT No.: PCT/US2009/031626
§ 371 (c)(1),
(2), (4) Date: Sep. 9, 2010

(87) PCT Pub. No.: WO2009/117170
PCT Pub. Date: Sep. 24, 2009

(65) Prior Publication Data
US 2011/0000951 A1    Jan. 6, 2011

Related U.S. Application Data

(60) Provisional application No. 61/037,133, filed on Mar. 17, 2008.

(51) Int. Cl.
*B23K 31/00* (2006.01)
*B23K 31/12* (2006.01)

(52) U.S. Cl. .................. 228/180.5; 228/103; 228/904

(58) Field of Classification Search ............ 228/180.5, 228/904, 4.5, 102, 103, 8, 11
See application file for complete search history.

(56) References Cited

U.S. PATENT DOCUMENTS

| | | | | |
|---|---|---|---|---|
| 4,597,522 A | * | 7/1986 | Kobayashi | 228/180.5 |
| 4,771,930 A | * | 9/1988 | Gillotti et al. | 228/102 |
| 5,054,194 A | * | 10/1991 | Pollock | 29/840 |
| 5,150,828 A | * | 9/1992 | Shimizu | 228/102 |

(Continued)

FOREIGN PATENT DOCUMENTS

DE    10301743 A1 *  8/2003

(Continued)

OTHER PUBLICATIONS

International Search Report and Written Opinion dated Jun. 30, 2009 of International Application No. PCT/US2009/031626.

*Primary Examiner* — Kiley Stoner
*Assistant Examiner* — Carlos Gamino
(74) *Attorney, Agent, or Firm* — Christopher M. Spletzer, Sr.

(57) ABSTRACT

A method of calibrating a wire payout related to predetermined looping motions used during formation of a wire loop is provided. The method includes the steps of: (a) determining a first wire payout length related to predetermined wire looping motions used in the formation of a first of the wire loop, the predetermined looping motions being performed on a first wire bonding system; (b) determining a second wire payout length related to the predetermined wire looping motions used in the formation of a second of the wire loop; and (c) adjusting at least one wire bonding process variable, and repeating step (b) with the at least one adjusted wire bonding process variable such that the second wire payout length determined in the repeated step (b) is closer to the first wire payout length than the second wire payout length determined in the initial step (b).

22 Claims, 7 Drawing Sheets

---

STEP 500: DETERMINE A FIRST WIRE PAYOUT LENGTH RELATED TO PREDETERMINED WIRE LOOPING MOTIONS USED IN THE FORMATION OF A FIRST OF THE WIRE LOOP, THE PREDETERMINED LOOPING MOTIONS BEING PERFORMED ON A FIRST WIRE BONDING SYSTEM

↓

STEP 502: DETERMINE A SECOND WIRE PAYOUT LENGTH RELATED TO THE PREDETERMINED WIRE LOOPING MOTIONS USED IN THE FORMATION OF A SECOND OF THE WIRE LOOP, THE PREDETERMINED LOOPING MOTIONS USED DURING STEP 502 BEING PERFORMED ON ONE OF (1) A SECOND WIRE BONDING SYSTEM THAT IS DIFFERENT THAN THE FIRST WIRE BONDING SYSTEM, OR (2) THE FIRST WIRE BONDING SYSTEM WITH AT LEAST ONE WIRE BONDING SYSTEM VARIABLE CHANGED FROM STEP 500

↓

STEP 504: ADJUST AT LEAST ONE WIRE BONDING PROCESS VARIABLE, AND REPEATING STEP 502 WITH THE AT LEAST ONE ADJUSTED WIRE BONDING PROCESS VARIABLE SUCH THAT THE SECOND WIRE PAYOUT LENGTH DETERMINED IN THE REPEATED STEP 502 IS CLOSER TO THE FIRST WIRE PAYOUT LENGTH THAN THE SECOND WIRE PAYOUT LENGTH DETERMINED IN THE INITIAL STEP 502

U.S. PATENT DOCUMENTS

| | | | |
|---|---|---|---|
| 5,176,310 A * | 1/1993 | Akiyama et al. | 228/180.5 |
| 5,395,035 A * | 3/1995 | Nakao | 228/4.5 |
| 5,776,786 A * | 7/1998 | Nakamura et al. | 438/106 |
| 5,979,737 A * | 11/1999 | Farassat | 228/1.1 |
| 6,176,416 B1 * | 1/2001 | Tsai et al. | 228/180.5 |
| 6,739,496 B2 * | 5/2004 | Mayer et al. | 228/180.5 |
| 6,933,608 B2 | 8/2005 | Fujisawa | |
| 7,086,148 B2 * | 8/2006 | Bambridge et al. | 29/843 |
| 7,549,569 B2 * | 6/2009 | Kwan et al. | 228/212 |
| 7,624,904 B1 * | 12/2009 | Smith | 228/4.5 |
| 7,637,414 B2 * | 12/2009 | Bambridge et al. | 228/180.5 |

FOREIGN PATENT DOCUMENTS

| | | |
|---|---|---|
| EP | 0604782 A | 7/1994 |
| EP | 1306159 A1 * | 5/2003 |
| JP | 55156334 A * | 12/1980 |
| JP | 58067034 A * | 4/1983 |
| JP | 59150436 A * | 8/1984 |
| JP | 2000-277558 A | 10/2000 |
| JP | 2004-172477 A | 6/2004 |
| JP | 2004-319921 A | 11/2004 |
| JP | 2005235875 A * | 9/2005 |

* cited by examiner

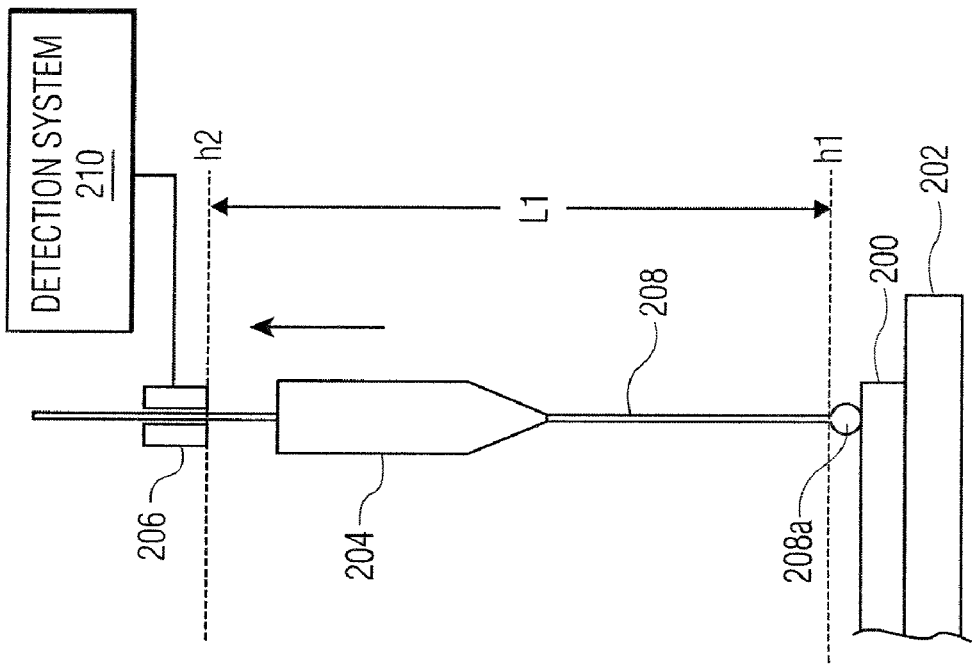
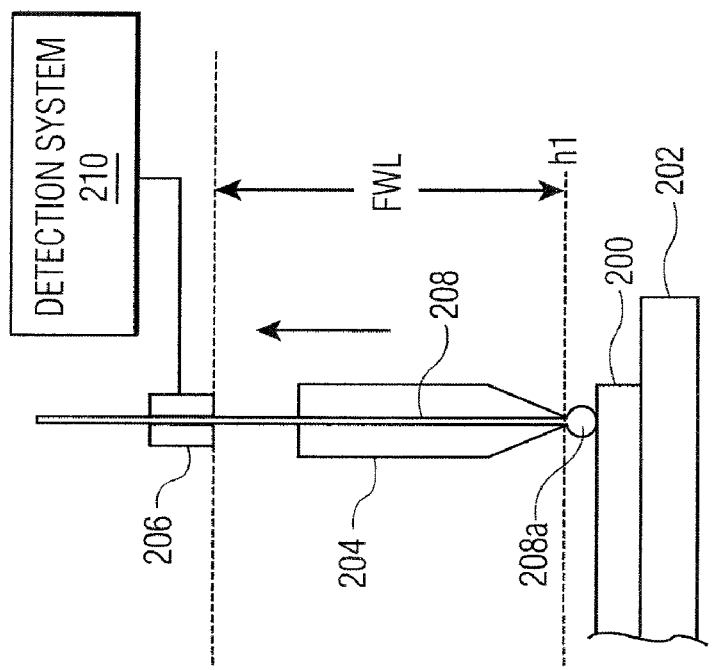
FIG. 2B
FIG. 2A

STEP 700: GENERATE A FIRST WIRE PAYOUT PROFILE, THE STEP OF GENERATING A FIRST WIRE PAYOUT PROFILE INCLUDES A STEP OF DETERMINING A PLURALITY OF FIRST WIRE PAYOUT LENGTHS RELATED TO PREDETERMINED WIRE LOOPING MOTIONS USED IN THE FORMATION OF A FIRST PLURALITY OF THE WIRE LOOP, THE PREDETERMINED LOOPING MOTIONS BEING PERFORMED ON A FIRST WIRE BONDING SYSTEM, EACH OF THE PLURALITY OF FIRST WIRE PAYOUT LENGTHS CORRESPONDING TO A DIFFERENT VALUE OF A PREDETERMINED PROCESS VARIABLE

STEP 702: GENERATE A SECOND WIRE PAYOUT PROFILE, THE STEP OF GENERATING A SECOND WIRE PAYOUT PROFILE INCLUDES A STEP OF DETERMINING A PLURALITY OF SECOND WIRE PAYOUT LENGTHS RELATED TO THE PREDETERMINED WIRE LOOPING MOTIONS USED IN THE FORMATION OF A SECOND PLURALITY OF THE WIRE LOOP, THE PREDETERMINED LOOPING MOTIONS USED DURING STEP 702 BEING PERFORMED ON ONE OF (1) A SECOND WIRE BONDING SYSTEM THAT IS DIFFERENT THAN THE FIRST WIRE BONDING SYSTEM, OR (2) THE FIRST WIRE BONDING SYSTEM WITH AT LEAST ONE WIRE BONDING SYSTEM VARIABLE CHANGED FROM STEP 700, EACH OF THE PLURALITY OF SECOND WIRE PAYOUT LENGTHS CORRESPONDING TO A DIFFERENT VALUE OF THE PREDETERMINED PROCESS VARIABLE

FIG. 7

STEP 800: BOND AN END OF A WIRE TO A BONDING LOCATION USING THE BONDING TOOL TO FORM A FIRST BOND, RAISING THE BOND HEAD WITH THE WIRE CLAMP OPEN UNTIL THE WIRE CLAMP IS A FIRST DISTANCE ABOVE A PREDETERMINED POINT SUCH THAT A LENGTH OF WIRE PAYS OUT STILL CONNECTED TO THE FIRST BOND, CLOSING THE WIRE CLAMP, RAISING THE BOND HEAD FURTHER SUCH THAT THE WIRE TEARS, AND DETERMINING A SECOND DISTANCE THAT THE WIRE CLAMP IS ABOVE THE PREDETERMINED POINT WHEN THE WIRE TEARS, WHEREBY A DIFFERENCE BETWEEN THE SECOND DISTANCE AND THE FIRST DISTANCE IS AN ELONGATION DISTANCE

STEP 802: BOND ANOTHER END OF A WIRE TO ANOTHER BONDING LOCATION USING THE BONDING TOOL TO FORM ANOTHER FIRST BOND, PERFORMING PREDETERMINED LOOPING MOTIONS WITH THE WIRE CLAMP OPEN AND RAISING THE BOND HEAD UNTIL THE WIRE CLAMP IS AT THE FIRST DISTANCE ABOVE THE PREDETERMINED POINT, CLOSING THE WIRE CLAMP, RAISING THE BOND HEAD FURTHER SUCH THAT THE WIRE TEARS, AND DETERMINING A THIRD DISTANCE THAT THE WIRE CLAMP IS ABOVE THE PREDETERMINED POINT WHEN THE WIRE TEARS

STEP 804: DETERMINE THE LENGTH OF WIRE IN THE WIRE LOOP, WHEREBY THE LENGTH OF WIRE IS EQUAL TO THE THIRD DISTANCE MINUS THE ELONGATION DISTANCE AND MINUS A FIXED WIRE LENGTH BETWEEN THE WIRE CLAMP AND A TIP OF THE BONDING TOOL

FIG. 8

WIRE PAYOUT MEASUREMENT AND CALIBRATION TECHNIQUES FOR A WIRE BONDING MACHINE

CROSS-REFERENCE TO RELATED APPLICATIONS

This application claims the benefit of PCT International Patent Application No. PCT/US2009/031626 filed Jan. 22, 2009, which claims the benefit of U.S. Provisional Application No. 61/037,133, filed Mar. 17, 2008, the contents of both of which are incorporated herein by reference.

FIELD OF THE INVENTION

The present invention relates to wire bonding machines, and more particularly, to techniques of measuring and calibrating wire payout on wire bonding machines.

BACKGROUND OF THE INVENTION

In the manufacture and processing of various semiconductor devices, wire bonding machines are often used to provide interconnections between components in the devices. The interconnections are typically provided in the form of a wire loop that is "bonded" between a first bonding location (e.g., a die pad of a semiconductor die) and a second bonding location (e.g., a conductive region of a substrate such as a lead of a leadframe). Such wire bonding machines typically include a wire feed system for feeding a wire on a wire spool to a bond head of the wire bonding machine. The bond head of the wire bonding machine typically carries a wire clamp, a transducer (e.g., an ultrasonic transducer) and a bonding tool (e.g., a capillary tool, a wedge tool, etc.), amongst other components.

The wire bonding machines provide for motion of the bonding tool (e.g., through the motion of the bond head) in order to form a wire loop of a desired shape. During motion of the bonding tool (e.g., while shaping the wire loop) the wire clamp is operated between an "open" and a "closed" position such that wire may be fed from a wire spool through the wire clamp when the wire clamp is open, but additional wire is not fed from the wire spool when the wire clamp is closed. The wire length that is fed past the wire clamp during the looping motions (i.e., when the wire clamp is open) is often termed the wire "payout."

It would be very desirable to know the wire payout provided by looping motions of a wire loop, because the wire payout will affect the ultimate shape of the wire loop. Conventionally, if desired, the wire payout has been calculated using offline manual measurements taken after the wire loop is formed. Such calculations tend to be inaccurate and time consuming. Problems arise because of the lack of accurate and timely measurements of wire payout. For example, process variables (e.g., the bonding tool used, tension provided by the wire feed system, amongst others) affect how much payout is provided in a given wire loop. When these variables change (e.g., on the same or different wire bonder platform) the wire payout also changes. Thus, inconsistent wire loops may undesirably result.

Thus, it would be desirable to provide techniques for measuring and/or calibrating wire payout, and to use the wire payout in conjunction with wire bonding operations.

SUMMARY OF THE INVENTION

According to an exemplary embodiment of the present invention, a method of calibrating a wire payout related to predetermined looping motions used during formation of a wire loop is provided. The wire loop is formed by a wire bonding system including a bond head, the bond head including a wire clamp and a bonding tool. The method includes the steps of: (a) determining a first wire payout length related to predetermined wire looping motions used in the formation of a first of the wire loop, the predetermined looping motions being performed on a first wire bonding system; (b) determining a second wire payout length related to the predetermined wire looping motions used in the formation of a second of the wire loop, the predetermined looping motions used during step (b) being performed on one of (1) a second wire bonding system that is different than the first wire bonding system, or (2) the first wire bonding system with at least one wire bonding system variable changed from step (a); and (c) adjusting at least one wire bonding process variable, and repeating step (b) with the at least one adjusted wire bonding process variable such that the second wire payout length determined in the repeated step (b) is closer to the first wire payout length than the second wire payout length determined in the initial step (b).

According to another exemplary embodiment of the present invention, a method of determining a wire payout related to looping motions used during formation of a wire loop is provided. The wire loop is formed by a wire bonding system including a bond head, the bond head including a wire clamp and a bonding tool. The method includes the steps of: (1) bonding an end of a wire to a bonding location using the bonding tool to form a first bond, raising the bond head with the wire clamp open until the wire clamp is a first distance above a predetermined point such that a length of wire pays out still connected to the first bond, closing the wire clamp, raising the bond head further such that the wire tears, and determining a second distance that the wire clamp is above the predetermined point when the wire tears; (2) bonding another end of a wire to another bonding location using the bonding tool to form another first bond, performing predetermined looping motions with the wire clamp open and raising the bond head until the wire clamp is at the first distance above the predetermined point, closing the wire clamp, raising the bond head further such that the wire tears, and determining a third distance that the wire clamp is above the predetermined point when the wire tears; and (3) determining the wire payout length, whereby the wire payout length (due to the additional looping motion of step (2)) is the difference between the third distance and the second distance.

According to yet another exemplary embodiment of the present invention, a method of calibrating a wire payout related to looping motions used during formation of a wire loop is provided. The wire loop is formed by a wire bonding system including a bond head, the bond head including a wire clamp and a bonding tool. The method includes the steps of: (a) generating a first wire payout profile, the step of generating a first wire payout profile includes a step of determining a plurality of first wire payout lengths related to predetermined wire looping motions used in the formation of a first plurality of the wire loop, the predetermined looping motions being performed on a first wire bonding system, each of the plurality of first wire payout lengths corresponding to a different value of a predetermined process variable; and (b) generating a second wire payout profile, the step of generating a second wire payout profile includes a step of determining a plurality of second wire payout lengths related to the predetermined wire looping motions used in the formation of a second plurality of the wire loop, the predetermined looping motions used during step (b) being performed on one of (1) a second wire bonding system that is different than the first wire bonding system, or (2) the first wire bonding system with at least one wire bonding system variable changed from step (a), each of the plurality of second wire payout lengths corresponding to a different value of the predetermined process variable.

According to yet another exemplary embodiment of the present invention, a method of determining a length of wire in a wire loop is provided. The wire loop is formed using predetermined looping motions by a wire bonding system, the wire bonding system including a bond head, the bond head including a wire clamp and a bonding tool. The method includes the steps of: (1) bonding an end of a wire to a bonding location using the bonding tool to form a first bond, raising the bond head with the wire clamp open until the wire clamp is a first distance above a predetermined point such that a length of wire pays out still connected to the first bond, closing the wire clamp, raising the bond head further such that the wire tears, and determining a second distance that the wire clamp is above the predetermined point when the wire tears, whereby a difference between the second distance and the first distance is an elongation distance; (2) bonding another end of a wire to another bonding location using the bonding tool to form another first bond, performing predetermined looping motions with the wire clamp open and raising the bond head until the wire clamp is at the first distance above the predetermined point, closing the wire clamp, raising the bond head further such that the wire tears, and determining a third distance that the wire clamp is above the predetermined point when the wire tears; and (3) determining the length of wire in the wire loop, whereby the length of wire is equal to the third distance minus the elongation distance and minus a fixed wire length between the wire clamp and a tip of the bonding tool.

The methods of the present invention may also be embodied as an apparatus (e.g., as part of the intelligence of a wire bonding machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2A is a block diagram view of elements of a wire bonding machine during a step of a method of measuring wire payout in accordance with an exemplary embodiment of the present invention;

FIG. 2B is a block diagram view of elements of a wire bonding machine during another step of a method of measuring wire payout in accordance with an exemplary embodiment of the present invention;

FIG. 7 is a flow diagram illustrating a method of calibrating a wire payout related to looping motions used during formation of a wire loop in accordance with an exemplary embodiment of the present invention; and FIG. 8 is a flow diagram illustrating a method of determining a length of wire in a wire loop in accordance with an exemplary embodiment of the present invention.

DETAILED DESCRIPTION OF THE INVENTION

Figure 1:
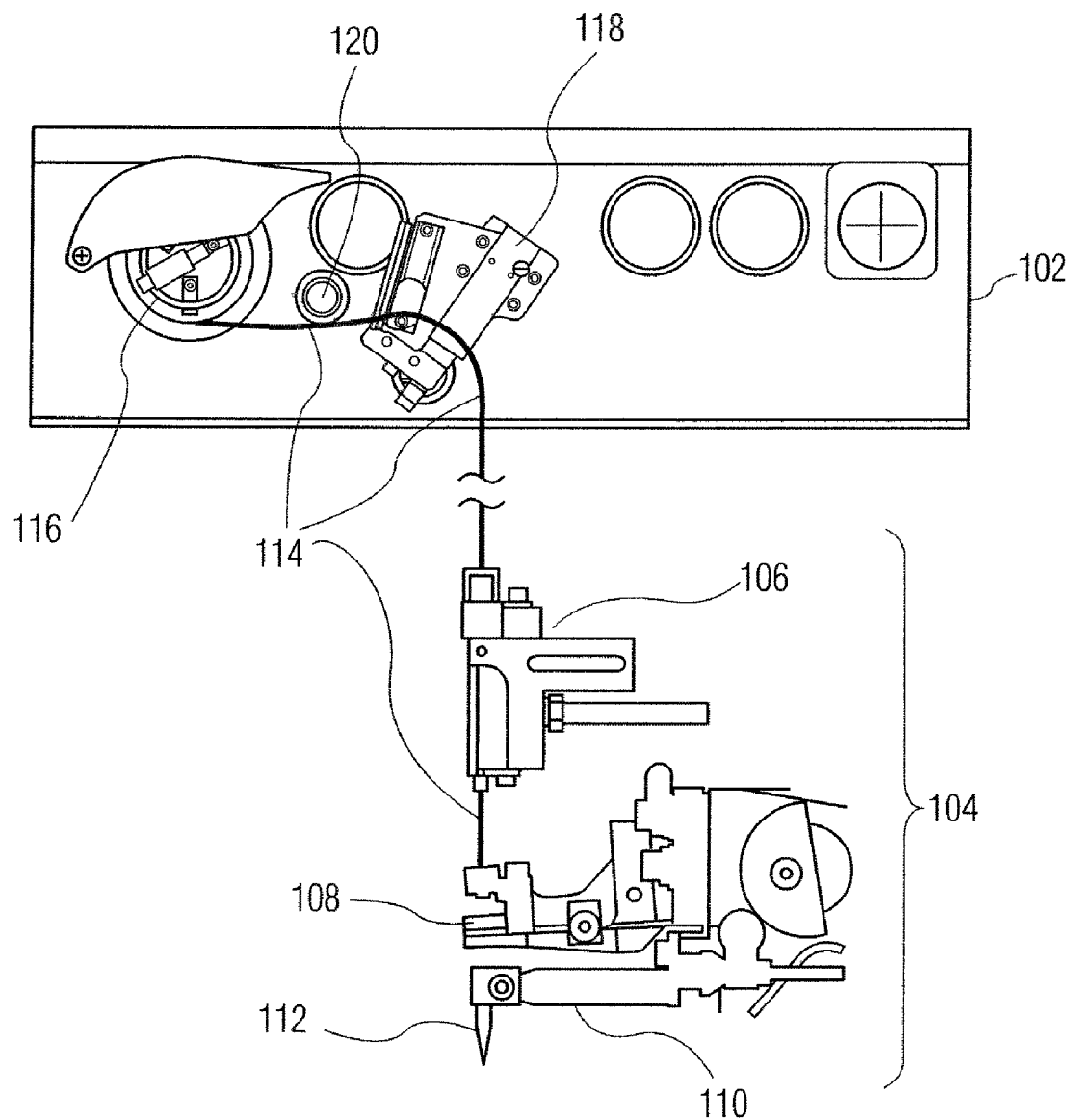
FIG. 1 is a front view of certain components of a wire bonding machine useful for explaining numerous exemplary embodiments of the present invention.

As used herein, the term "wire bonding system variable" relates to number of system features on a wire bonding machine that may be changed. As is understood by those skilled in the art, wire bonding system variables include a bonding tool type, a wire type, the direction of forming the wire loop (e.g., a 12 o'clock loop versus a 6 o'clock loop), the wire feed system variables, the wire tensioner system variables, amongst others.

As used herein, the term "wire bonding process variable" relates to number of process features related to a wire bonding process that may be changed. As is understood by those skilled in the art, wire bonding process variables include a wire tensioner setting, an air guide setting, looping parameters (e.g., shaping motions, kinking motions, looping speed), amongst others.

According to the certain exemplary embodiments of the present invention, improved methods of determining wire lengths and wire payout lengths, as well as improved methods of calibrating wire payout, are provided. These techniques may be used to improve various wire bonding operations. As used herein, the term "wire payout" may have a number of different meanings depending on the context in which it is used. For example, the wire payout associated with a wire loop may be considered to be the length of wire in the wire loop. In contrast, the wire payout associated with looping motions is the length of wire that is in a wire loop because of looping motions (e.g., shaping, bending, etc.) which is beyond that length that would be in a relatively "straight" loop. More details will follow on each of these expressions below. Nonetheless, it will be clear to one skilled in the art that either of the expressions (or other related expressions) may be used in connection with similar wire bonding operations.

As provided above, during wire looping, wire payout (e.g., the magnitude of the wire payout) is important, for example, because the wire payout is related to the ultimate wire loop shape. There are many variables that affect wire payout, for example, friction in a capillary bonding tool, variation in the tension provided by the wire feed system, the direction of the wire loop being formed (e.g., 12 o'clock direction, 6 o'clock direction, etc.) amongst others. Certain exemplary techniques of the present invention are directed at providing a more consistent and desirable wire payout. As detailed below, an exemplary system and method measures the wire payout after certain looping motions and uses the measured payout data to perform automatic adjustment to achieve the desired looping.

For example, certain of the techniques described herein may be used to automatically measure wire payout during wire looping, and to further automatically compensate for directional differences (i.e., changes in the direction of forming a wire loop such as a 12 o'clock loop versus a 6 o'clock loop) such that there is a more uniform wire payout.

On line wire payout measurement can be used to compensate for uncontrolled variables such as tension variation, friction variation, capillary variation, looping direction variation, etc. It can also be used to calibrate machine to machine looping portability and provide conversions between different machines and different generations of wire bonders.

FIG. 1 illustrates certain components of a wire bonding machine including (1) wire feed system 102 and (2) components of optics housing/bondhead 104. The illustrated components of optics housing/bondhead 104 include wire tensioner 106, wire clamp assembly 108, ultrasonic transducer 110, and wire bonding tool 112 (other components of optics housing/bondhead 104, including certain components providing interconnection between the illustrated components of optics housing/bondhead 104, are not shown in FIG. 1).

Wire feed system 102 (of which certain components are omitted for clarity) includes wire spool mount 116 (configured to receive a wire supply such as a wire spool), wire guide bar 120 (e.g., diverter bar 120), and air guide 118. Wire 114 extends from wire spool mount 116 (where spool mount 116 holds a spool that supplies length of wire 114) and rides along wire guide bar 120 and components of air guide 118, ultimately being routed through wire tensioner 106. In actual operation wire 114 would continue through wire clamp assembly 108 to wire bonding tool 112.

FIG. 2A illustrates semiconductor die 200 which is mounted on substrate 202 (e.g., leadframe 202). Also illustrated is bonding tool 204, wire clamp 206, wire 208 and detection system 210. Bonding tool 204 and wire clamp are carried by a bond head which is not shown in FIG. 2A. As is known to those skilled in the art, wire 208 extends through a wire feed system (such as wire feed system 102 shown in FIG. 1), ultimately extending through wire clamp 206 and bonding tool 204. On an end of wire 208 free air ball 208a has been formed (e.g., using an electronic flame-off system or the like).

As shown in FIG. 2A, free air ball 208a at an end of wire 208 is bonded to a bonding location (e.g., a die pad on semiconductor die 200) using bonding tool 204 to form a first bond. Because wire clamp 206 is closed in FIG. 2A, detection system 210 senses the conductive contact that has been established between free air ball 208a and the bonding location (i.e., as is understood by those skilled in the art, in the illustrated embodiment the conductive path sensed by detection system 210 passes through wire clamp 206). Also shown in FIG. 2A is a fixed wire length (FWL) between wire clamp 206 and a tip of bonding tool 204. Because wire clamp 206 and bonding tool 204 move together along the various motions axes as parts of a bond head assembly, the FWL tends to be substantially constant or fixed.

At FIG. 2B, after free air ball 208a has been bonded to the bonding location to form the first bond (the bonded free air ball 208a will now be referred to as first bond 208a), the bond head (carrying wire clamp 206 and bonding tool 204) is raised with wire clamp 206 open until wire clamp 206 is a first distance (in the exemplary embodiment of the present invention shown in FIG. 2B, the first distance is "L1") above a predetermined point such that a length of wire 208 pays out still connected to first bond 208a. More specifically, in the example shown in FIG. 2B, first distance L1 is the distance between height h1 (a substantially fixed height at the top of first bond 208a) and height h2 (the bottom of wire clamp 206).

In the exemplary embodiment of the present invention shown in FIG. 2B, the predetermined point is first bond 208a, and the first distance ("L1") is the distance from first bond 208a to the bottom of wire clamp 206; however, it is clear that this is an exemplary configuration and the present invention is not limited thereto. Rather, the predetermined point may be any of a number of locations such as the bond plane, the table surface, a surface of semiconductor die 200, a surface of substrate 202, amongst others. Likewise, the first distance ("L1") (as well as fixed wire length "FWL") need not be measured with respect to the bottom of wire clamp 206: for example, the first distance may be measured with respect to any predetermined part of wire clamp 206, or may be selected with respect to another part of the system (and not with respect to wire clamp 206 at all).

Figure 2C:
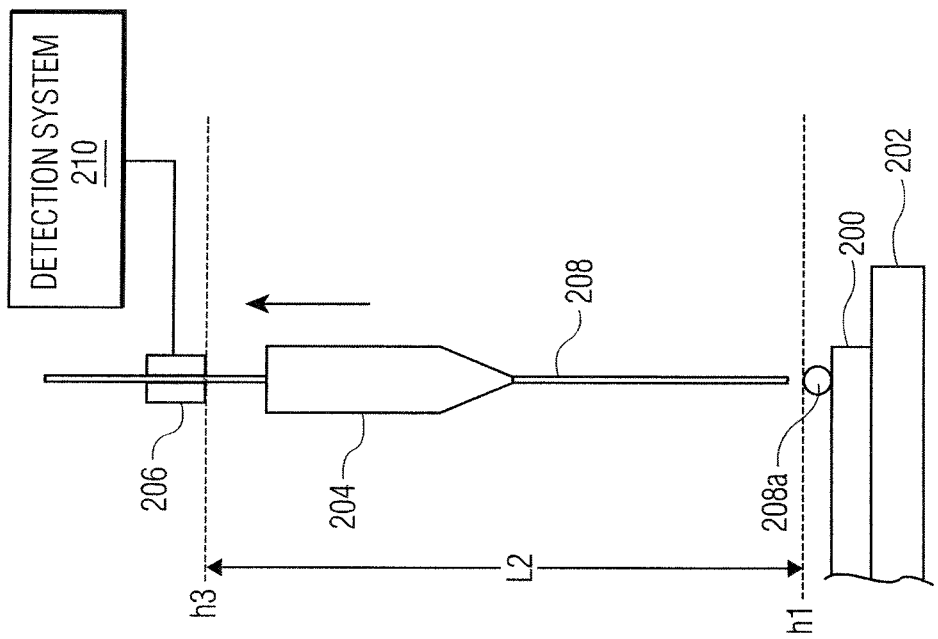
FIG. 2C is a block diagram view of elements of a wire bonding machine during yet another step of a method of measuring wire payout in accordance with an exemplary embodiment of the present invention.
Figure 2D:
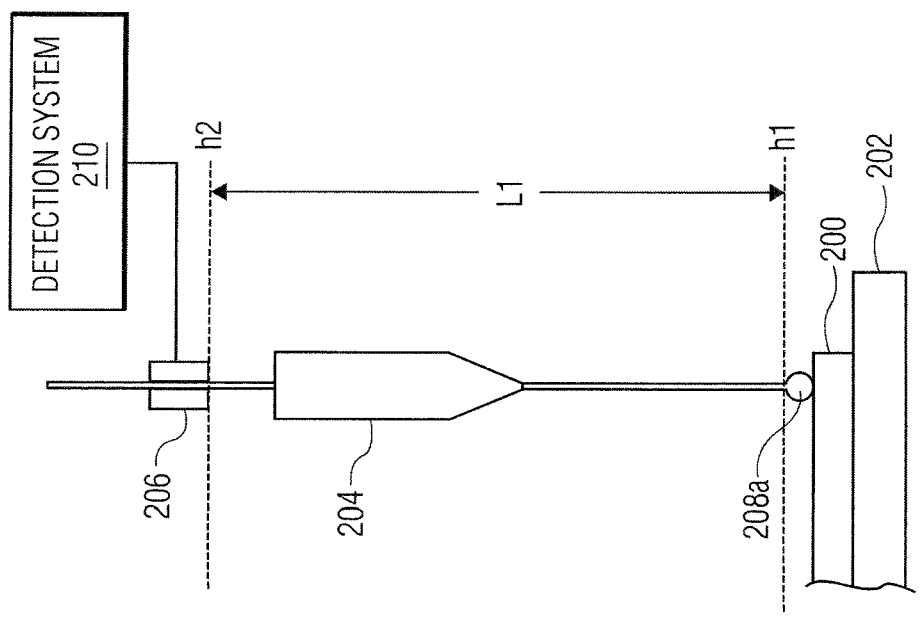
FIG. 2D is a block diagram view of elements of a wire bonding machine during yet another step of a method of measuring wire payout in accordance with an exemplary embodiment of the present invention.

After the step shown at FIG. 2B, wire clamp 206 is closed at FIG. 2C. Then, as shown in FIG. 2D, the bond head (carrying wire clamp 206 and bonding tool 204) is further raised such that wire 208 tears at a second distance ("L2") above the predetermined point. More specifically, in the example shown in FIG. 2D, second distance L2 is the distance between height h1 (a substantially fixed height at the top of first bond 208a) and height h3 (the bottom of wire clamp 206).

Through the operation conducted in the steps shown in FIGS. 2A-2D, an elongation factor of wire 208 may be measured. That is, the difference between L2 and L1 may be substantially attributed to the elongation of wire 208 prior to tearing. The elongation factor tends to vary from one type of wire to another type of wire. As will be explained below, the elongation factor may be used in connection with the present invention.

Figure 3B:
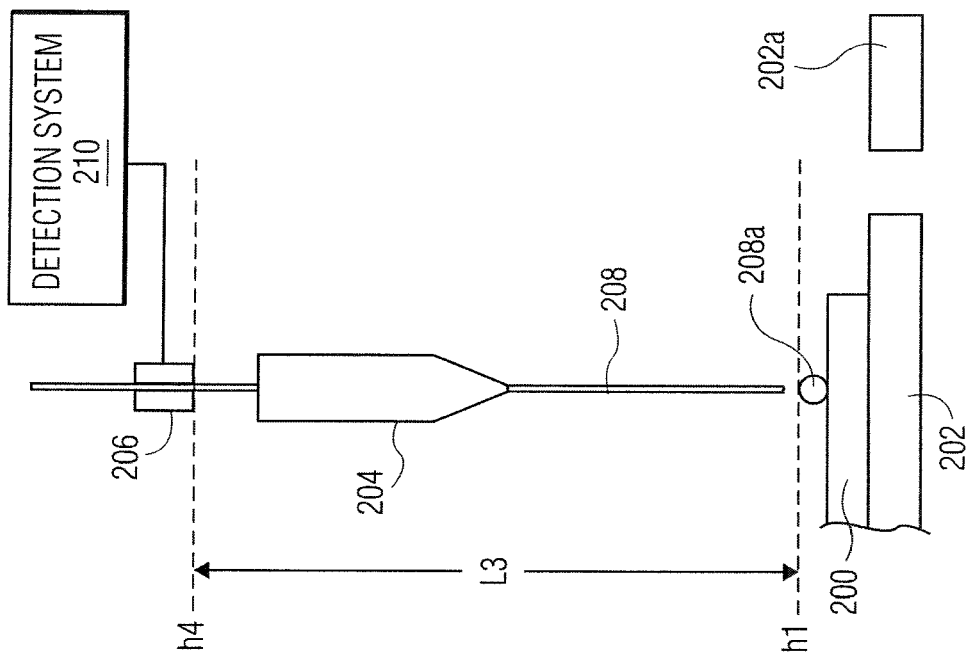
FIG. 3B is a block diagram view of elements of a wire bonding machine during yet another step of a method of measuring wire payout in accordance with an exemplary embodiment of the present invention.
Figure 3A:
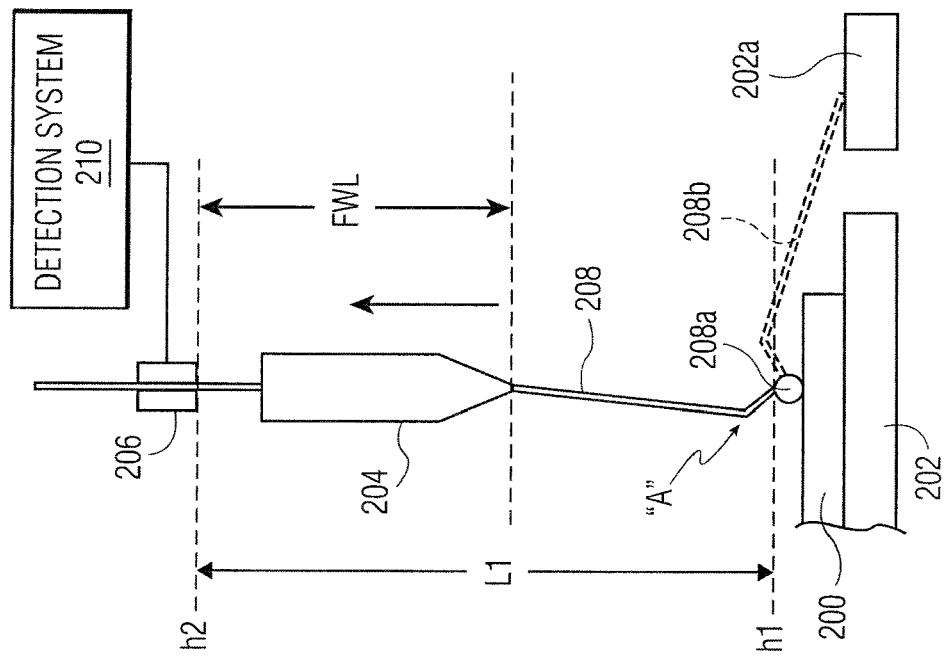
FIG. 3A is a block diagram view of elements of a wire bonding machine during yet another step of a method of measuring wire payout in accordance with an exemplary embodiment of the present invention.

Referring now to FIGS. 3A-3B, various components shown in FIGS. 2A-2D are shown with the same reference numerals. Also shown is portion 202a of substrate 202 (e.g., lead 202a of leadframe 202). Also shown is kinked portion "A" of wire 208. As is understood by those skilled in the art, various bends, kinks, and other motions are typically used to form a wire loop. These bends, kinks and motions may be generally referred to as "predetermined looping motions."

In fact, in order to form a wire loop such as wire loop 208b (shown in dotted lines in a bonded position in FIG. 3A), the process begins in a manner similar to that shown in FIG. 2A. That is, free air ball 208a at an end of wire 208 has been bonded to a bonding location (e.g., a bond pad on semiconductor die 200) using bonding tool 204 to form a first bond (the bonded free air ball 208a will now be referred to as first bond 208a). However, in contrast to the step shown in FIG. 2B where wire clamp 206 (being carried by the bond head along with bonding tool 204) is raised in a substantially vertical direction to height h2, in FIG. 3A the predetermined looping motions are performed and then wire clamp 206 is raised to height h2 (e.g., height h2 may be the top of loop height as known to those skilled in the art). After the predetermined looping motions are performed (such that the wire has the general shape of the desired wire loop), wire clamp 206 is closed. Then, as shown in FIG. 3B, the bond head is further raised until wire 208 tears at a third distance ("L3") above the predetermined point. More specifically, in the example shown in FIG. 3B, third distance L3 is the distance between height h1 (a substantially fixed height at the top of first bond 208a) and height h4 (the bottom of wire clamp 206).

Through the operation shown in FIGS. 3A-3B, a wire payout length associated with the predetermined looping motions may be determined, where the wire payout length is the difference between the third distance L3 and the second distance L2. That is, additional wire length (i.e., the wire payout length associated with the predetermined looping motions) is in the wire of FIGS. 3A-3B in comparison to length of wire shown in FIGS. 2A-2D. This additional length is essentially the difference between length L3 and length L2, and is present in the wire of FIGS. 3A-3B because of the predetermined looping motions.

As will be explained below with respect to FIGS. 4-8, the techniques described above with respect to FIGS. 2A-2D and FIGS. 3A-3B may be used in connection with various measurement, calibration, and operational techniques.

Figure 4:
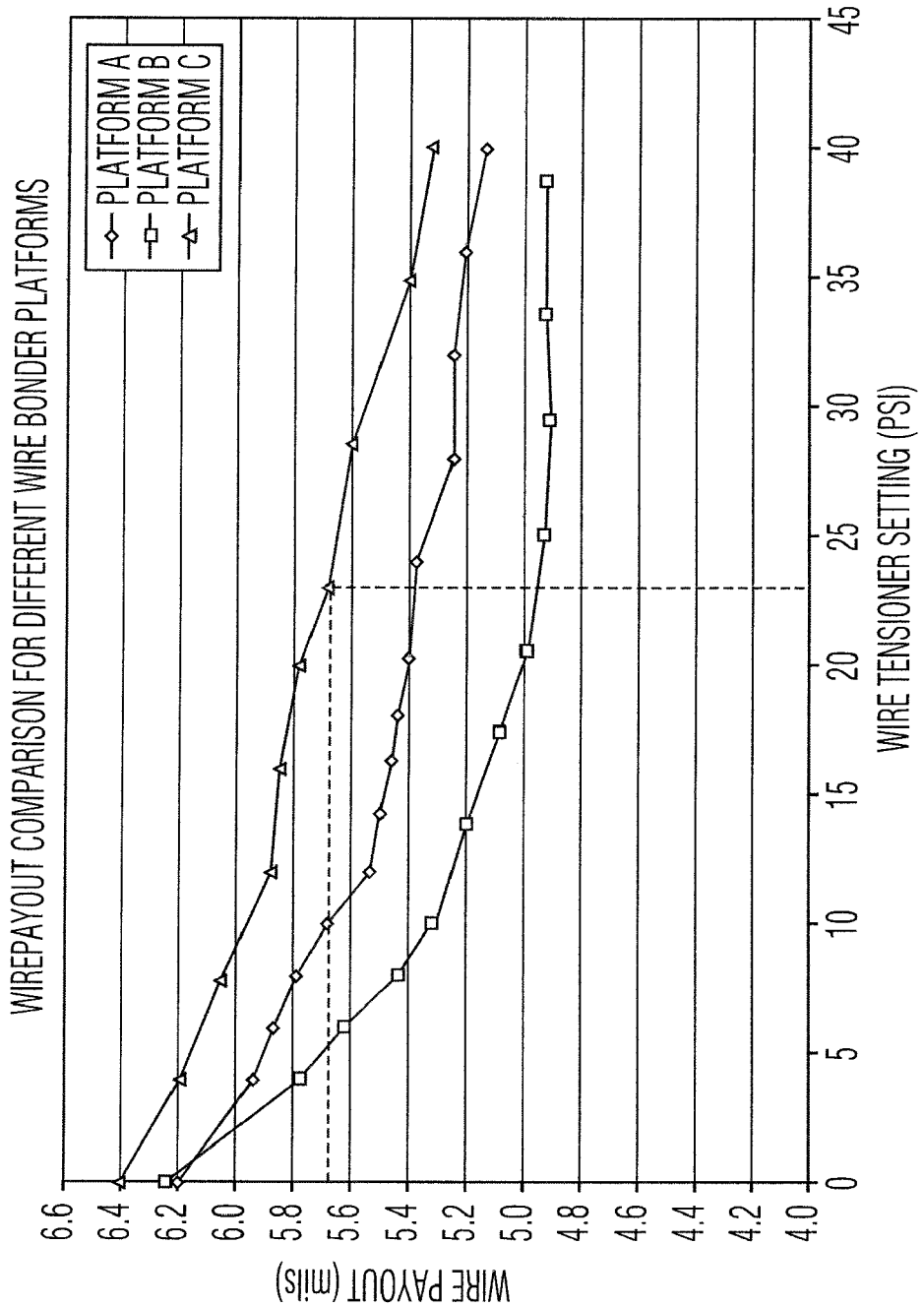
FIG. 4 is a graph comparing wire payout for different wire bonder platforms that may be generated in accordance with an exemplary embodiment of the present invention.

FIG. 4 is a graph comparing wire payout profiles for three different wire bonder platforms (i.e., wire bonder platforms A, B, and C). Essentially, profiles such as those shown in FIG. 4 may be obtained by checking the wire payout length (e.g., the additional length of wire in a given wire loop because of predetermined looping motions) for each of the wire bonder platforms at each of a plurality of values of a predetermined process variable. For example, in FIG. 4, for each platform, the wire payout is measured (e.g., using a method such as that described above in connection with FIGS. 2A-2D and FIGS. 3A-3B) at a plurality of wire tensioner setting values. These three wire payout profiles may be used in order to calibrate a wire payout related to looping motions used during formation of a wire loop. More specifically, assume that a user of platform A uses a wire tensioner setting of 10 psi to achieve a desired loop shape with a wire payout of 5.68 mils as shown in FIG. 4. That is, the resulting wire loops when the wire payout is 5.68 mils are desirable. Now assume that the user wants to start using platform C. Platform C may have various differences from platform A such that even under the same process parameters the wire payout will not be the same. The user desires to have the same wire payout value of 5.68 mils. The user can extrapolate from the profiles of FIG. 4 and determine that the desired wire tensioner setting on platform C to get a wire payout associated with the looping motions of 5.68 mils is about 23 psi. Thus, when using platform C to form wire loops the user may now set the wire tensioner setting at 23 psi and expect to get wire payout values that are very close to 5.68 mils.

Of course, the wire payout profiles illustrated in FIG. 4 are exemplary in nature. Different types of wire payout profiles are contemplated. For example, the process variable used to profile the wire payout data does not need to be the wire tensioner setting as any of a number of process variables may be used (e.g., a wire feed system setting variable or other process variables as understood by those skilled in the art). Likewise, the wire payout profiles need not be specific to different wire bonder platforms. For example, the profiles may correspond to the same platform, but with at least one wire bonding system variable (e.g., the bonding tool type, the wire type, the direction of forming the wire loop, the wire feed system, the wire tensioner system, etc.) changed from machine to machine (or from wire loop to wire loop on the same machine).

FIGS. 5-8 are flow diagrams in accordance with certain exemplary embodiments of the present invention. As is understood by those skilled in the art, certain steps included in the flow diagrams may be omitted; certain additional steps may be added; and the order of the steps may be altered from the order illustrated.

Figure 5:
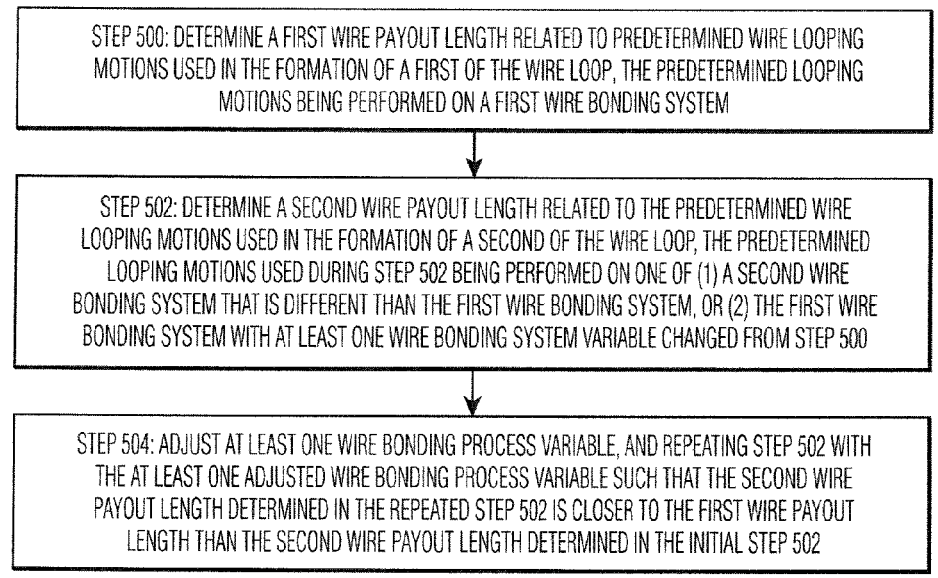
FIG. 5 is a flow diagram illustrating a method of calibrating a wire payout related to predetermined looping motions used during formation of a wire loop in accordance with an exemplary embodiment of the present invention.

FIG. 5 is a flow diagram illustrating a method of calibrating a wire payout related to predetermined looping motions used during formation of a wire loop in accordance with an exemplary embodiment of the present invention. The wire loop is formed by a wire bonding system including a bond head, the bond head including a wire clamp and a bonding tool. At step 500, a first wire payout length related to predetermined wire looping motions used in the formation of a first of the wire loop is determined. The predetermined looping motions are performed on a first wire bonding system (e.g., a first type of wire bonding machine). For example, the first wire payout length may be determined using techniques such as those described above with respect to FIGS. 2A-2D and FIGS. 3A-3B, or other techniques. In such a situation, let us assume that the second distance (L2) determined in FIG. 2D is 500 mils. Further, let us assume that the third distance (L3) determined in FIG. 3B is 510 mils. Thus, the wire payout length associated with the looping motions is 10 mils (L3 minus L2).

At step 502, a second wire payout length related to the predetermined wire looping motions used in the formation of a second of the wire loop is determined. The predetermined looping motions used during step 502 are performed on one of (1) a second wire bonding system that is different than the first wire bonding system, or (2) the first wire bonding system with at least one wire bonding system variable changed from step 500. Again, the second wire payout length may be determined using techniques such as those described above with respect to FIGS. 2A-2D and FIGS. 3A-3B. In such a situation, let us assume that the wire payout length associated with the looping motions is 6 mils (L3 minus L2). However, we would like to have the second wire payout length be closer to the first wire payout length of step 500 (ideally, the second wire payout length would be the same as the wire payout length of step 500 to have more consistent wire loops). Therefore, we proceed to step 504, where at least one wire bonding process variable is adjusted. For example, the adjusted wire bonding process variable may be a wire tensioner setting (or a wire feed system setting, or other process variables which may be varied as understood by those skilled in the art). At step 504, step 502 is repeated with the at least one adjusted wire bonding process variable such that the second wire payout length determined in the repeated step 502 is closer to the first wire payout length than the second wire payout length determined in the initial step 502. As will be appreciated by those skilled in the art, step 504 may be repeated several times until the wire payout length reaches a desired range (e.g., between 9-11 mils or whatever the desired range may be in a given application).

Figure 6:
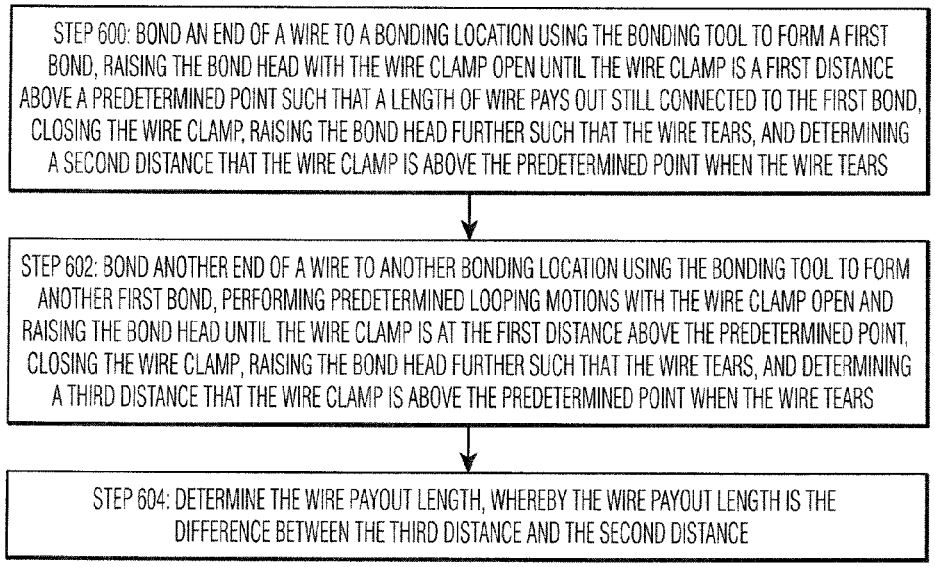
FIG. 6 is a flow diagram illustrating a method of determining a wire payout related to looping motions used during formation of a wire loop in accordance with an exemplary embodiment of the present invention.

FIG. 6 is a flow diagram illustrating a method of determining a wire payout related to looping motions used during formation of a wire loop in accordance with an exemplary embodiment of the present invention. The wire loop is formed by a wire bonding system including a bond head, the bond head including a wire clamp and a bonding tool. At step 600, an end of a wire is bonded to a bonding location using the bonding tool to form a first bond. For example, referring to FIG. 2A, free air ball 208*a* is bonded to a bonding location to form first bond 208*a*. Then the bond head is raised with the wire clamp open until the wire clamp is a first distance above a predetermined point such that a length of wire pays out still connected to the first bond. For example, in FIG. 2B the bond head is raised such that wire clamp 206 is first distance (L1) above first bond 208*a*. Then the wire clamp is closed (as in FIG. 2C), and the bond head is raised further such that the wire tears (as in FIG. 2D). Then a second distance (e.g., distance L2 in FIG. 2D) that the wire clamp is above the predetermined point (e.g., first bond 208*a* in FIG. 2D) when the wire tears is determined.

At step 602, another end of a wire is bonded to another bonding location using the bonding tool to form another first bond. For example, this may correspond to forming another first bond as in FIG. 2A. Then predetermined looping motions are performed with the wire clamp open (e.g., to shape the wire as in FIG. 3A including kinked portion "A"), and then the bond head is raised until the wire clamp is at the first distance above the predetermined point (e.g., in FIG. 3A, after the predetermined looping motions have been completed the bond head has been raised such that wire clamp is first distance L1 above first bond 208a). Then the wire clamp is closed (e.g., as shown in FIG. 3A), and then the bond head is raised further such that the wire tears (e.g., as shown in FIG. 3B). Then a third distance (e.g., distance L3 in FIG. 3B) that the wire clamp is above the predetermined point when the wire tears is determined. At step 604, the wire payout length is determined, whereby the wire payout length is the difference between the third distance and the second distance. For example, referring to FIGS. 2A-2D and FIGS. 3A-3B, the wire payout length is L3 minus L2.

FIG. 7 is a flow diagram illustrating a method of calibrating a wire payout related to looping motions used during formation of a wire loop in accordance with an exemplary embodiment of the present invention. The wire loop is formed by a wire bonding system including a bond head, the bond head including a wire clamp and a bonding tool. At step 700, a first wire payout profile is generated. The step of generating a first wire payout profile includes a step of determining a plurality of first wire payout lengths related to predetermined wire looping motions used in the formation of a first plurality of the wire loop. The predetermined looping motions are performed on a first wire bonding system, where each of the plurality of first wire payout lengths corresponds to a different value of a predetermined process variable. For example, in FIG. 4, one profile corresponds to wire bonder platform A, where each of the wire payout values corresponds to a different value of the wire tensioner process variable. At step 702, a second wire payout profile is generated. The step of generating a second wire payout profile includes a step of determining a plurality of second wire payout lengths related to the predetermined wire looping motions used in the formation of a second plurality of the wire loop. The predetermined looping motions used during step 702 are performed on one of (1) a second wire bonding system that is different than the first wire bonding system, or (2) the first wire bonding system with at least one wire bonding system variable changed from step 700, where each of the plurality of first wire payout lengths corresponding to a different value of a predetermined process variable. For example, in FIG. 4, a second profile corresponds to wire bonder platform B (and a third profile corresponds to wire bonder platform C), where each of the wire payout values corresponds to a different value of the wire tensioner process variable. Using these profiles, one can achieve a desired wire payout on a given platform by varying the process variable (such as the technique described above by varying the tensioner setting to 23 psi to achieve a payout of 5.68 mils).

While FIG. 4 relates to 3 different wire bonder platforms for each of the curves (i.e., platform A, platform B, and platform C), the same techniques may be applied to other functions such as to equalize wire loops formed in different directions (on the same or on a different device). As is known to those skilled in the art, wire loops formed in different directions (e.g., a 12 o'clock wire loop versus a 6 o'clock wire loop) may be have different characteristics (e.g., different lengths of wire, different shapes, etc.). The present invention may be used in connection with the substantial normalization of the wire loops. For example, a first curve (i.e., wire payout profile) may relate to a wire loop extending in the 12 o'clock direction, while a second curve (i.e., wire payout profile) may relate to a wire loop extending in the 6 o'clock direction. In order to normalize a characteristic of the two wire loops (e.g., the wire payout), the curves can be compared and a process variable (such as the wire tension) may be varied to normalize the wire payout in wire loops formed in different directions.

FIG. 8 is a flow diagram illustrating a method of determining a length of wire in a wire loop in accordance with an exemplary embodiment of the present invention. The wire loop is formed using predetermined looping motions by a wire bonding system, the wire bonding system including a bond head, the bond head including a wire clamp and a bonding tool. At step 800, an end of a wire is bonded to a bonding location using the bonding tool to form a first bond (e.g., referring to FIG. 2A, free air ball 208a is bonded to a bonding location to form first bond 208a), and then the bond head is raised with the wire clamp open until the wire clamp is a first distance above a predetermined point such that a length of wire pays out still connected to the first bond (e.g., in FIG. 2B the bond head is raised such that wire clamp 206 is first distance (L1) above first bond 208a). Then the wire clamp is closed (e.g., as in FIG. 2C), and then the bond head is raised further such that the wire tears (e.g., as in FIG. 2D). Then a second distance that the wire clamp is above the predetermined point when the wire tears is determined (e.g., L2 in FIG. 2D), whereby a difference between the second distance and the first distance is an elongation distance. Thus referring to the example shown in FIGS. 2A-2D, the elongation distance is L2 minus L1.

At step 802, another end of a wire is bonded to another bonding location using the bonding tool to form another first bond. For example, this may correspond to forming another first bond as in FIG. 2A. Then predetermined looping motions are performed with the wire clamp open (e.g., to shape the wire as in FIG. 3A including kinked portion "A"). Then the bond head is raised until the wire clamp is at the first distance above the predetermined point (e.g., first distance L1 in FIG. 3A). Then the wire clamp is closed, and then the bond head is raised further such that the wire tears (e.g., as shown in FIG. 3B). Then a third distance (e.g., distance L3 in FIG. 3B) that the wire clamp is above the predetermined point when the wire tears is determined. At step 804, the length of wire in the wire loop is determined, whereby the length of wire is the third distance (e.g., L3 in FIG. 3B) minus the elongation distance (e.g., L2 minus L1 in FIGS. 2A-2B) and minus the fixed wire length (or FWL shown in FIGS. 2A and 3A). For example, assume that L3 in FIG. 3B is measured to be 600 mils. Further, assume that the fixed wire length FWL is known to be 500 mils. Further, assume that the elongation distance is determined to be 10 mils (e.g., using the technique FIGS. 2A-2D where the elongation distance is L2-L1). Thus, the wire in the wire loop if 90 mils (i.e., 600 mils minus 500 mils, and minus 10 mils, equals 90 mils).

The techniques of the present invention may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the techniques.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of calibrating a wire payout related to predetermined looping motions used during formation of a wire loop, the wire loop being formed by a wire bonding system including a bond head, the bond head including a wire clamp and a bonding tool, the method comprising the steps of:
   (a) determining a first wire payout length related to predetermined wire looping motions used in forming a first wire loop, the predetermined looping motions being performed on a first wire bonding system, the first wire payout length related to the predetermined wire looping motions being a length of wire in the first wire loop caused by the predetermined looping motions which is beyond a length that would be in a relatively straight wire loop;
   (b) determining a second wire payout length related to the predetermined wire looping motions used in forming a second wire loop, the predetermined looping motions used during step (b) being performed on one of (1) a second wire bonding system that is different than the first wire bonding system, or (2) the first wire bonding system with at least one wire bonding system variable changed from step (a), the second wire payout length related to the predetermined looping motions being a length of wire in the second wire loop caused by the predetermined wire looping motions which is beyond a length that would be in a relatively straight wire loop; and
   (c) adjusting at least one wire bonding process variable, and repeating step (b) with the at least one adjusted wire bonding process variable such that the second wire payout length determined in the repeated step (b) is closer to the first wire payout length than the second wire payout length determined in the initial step (b).

2. The method of claim 1 wherein, using the first wire bonding system, step (a) includes:
   (1) bonding an end of a wire to a bonding location using a bonding tool of the first wire bonding system to form a first bond, raising a bond head with a wire clamp open until the wire clamp is a first distance above a predetermined height such that a length of wire pays out still connected to the first bond, closing the wire clamp, raising the bond head further such that the wire tears, and determining a second distance that the wire clamp is above the predetermined height when the wire tears;
   (2) bonding another end of the wire to another bonding location using the bonding tool to form another first bond, performing predetermined looping motions with the wire clamp open and raising the bond head until the wire clamp is at the first distance above the predetermined height, closing the wire clamp, raising the bond head further such that the wire tears, and determining a third distance that the wire clamp is above the predetermined height when the wire tears; and
   (3) determining the first wire payout length, whereby the first wire payout length is the difference between the third distance and the second distance.

3. The method of claim 1 wherein, using the second wire bonding system, or using the first wire bonding system with the at least one wire bonding system variable changed, step (b) includes:
   (1) bonding an end of a wire to a bonding location using a bonding tool to form a first bond, raising a bond head with a wire clamp open until the wire clamp is a first distance above a predetermined height such that a length of wire pays out still connected to the first bond, closing the wire clamp, raising the bond head further such that the wire tears, and determining a second distance that the wire clamp is above the predetermined height when the wire tears;
   (2) bonding another end of the wire to another bonding location using the bonding tool to form another first bond, performing the predetermined looping motions with the wire clamp open and raising the bond head until the wire clamp is at the first distance above the predetermined height, closing the wire clamp, raising the bond head further such that the wire tears, and determining a third distance that the wire clamp is above the predetermined height when the wire tears; and
   (3) determining the second wire payout length, whereby the second wire payout length is the difference between the third distance and the second distance.

4. The method of claim 1 wherein step (b) includes determining the second wire payout length related to the predetermined wire looping motions used in forming the second wire loop, the predetermined looping motions used during step (b) being performed on the first wire bonding system with at least one wire bonding system variable changed during formation of the wire loop, the at least one wire bonding system variable being changed including at least one of a changed bonding tool type, a changed wire type, a change in the direction of forming the wire loop, a change in a wire feed system, and a change in a wire tensioner system.

5. The method of claim 1 wherein at least one of step (a) and step (b) includes a step of compensating for an elongation of the wire used in the formation of the wire loop in the determination of the respective one of the first wire payout length and the second wire payout length.

6. The method of claim 1 wherein step (c) of adjusting at least one wire bonding process variable includes varying at least one of an air guide setting and a wire tensioner setting.

7. The method of claim 1 wherein step (b) includes determining the second wire payout length related to the predetermined wire looping motions used in forming the second wire loop, the predetermined looping motions used during step (b) being performed on the first wire bonding system with at least one wire bonding system variable changed during formation of the second wire loop, the at least one wire bonding system variable being changed including a changed bonding tool type.

8. The method of claim 1 wherein step (b) includes determining the second wire payout length related to the predetermined wire looping motions used in forming the second wire loop, the predetermined looping motions used during step (b) being performed on the first wire bonding system with at least one wire bonding system variable changed during formation of the second wire loop, the at least one wire bonding system variable being changed including a changed wire type.

9. The method of claim 1 wherein step (b) includes determining the second wire payout length related to the predetermined wire looping motions used in forming the second wire loop, the predetermined looping motions used during step (b) being performed on the first wire bonding system with at least one wire bonding system variable changed during formation of the second wire loop, the at least one wire bonding system variable being changed including a change in a direction of forming a wire loop.

10. The method of claim 1 wherein step (b) includes determining the second wire payout length related to the predetermined wire looping motions used in forming the second wire loop, the predetermined looping motions used during step (b) being performed on the first wire bonding system with at least one wire bonding system variable changed during formation of the second wire loop, the at least one wire bonding system variable being changed including a change in a wire feed system.

11. The method of claim 1 wherein step (b) includes determining the second wire payout length related to the predetermined wire looping motions used in forming the second wire loop, the predetermined looping motions used during step (b) being performed on the first wire bonding system with at least one wire bonding system variable changed during formation of the second wire loop, the at least one wire bonding system variable being changed including a change in a wire tensioner system.

12. A method of calibrating a wire payout related to predetermined looping motions used during formation of a wire loop, the wire loop being formed by a wire bonding system including a bond head, the bond head including a wire clamp and a bonding tool, the method comprising the steps of:
  (a) determining a first wire payout length related to predetermined wire looping motions used in forming a first wire loop, the predetermined looping motions being performed on a first wire bonding system;
  (b) determining a second wire payout length related to the predetermined wire looping motions used in forming a second wire loop, the predetermined looping motions used during step (b) being performed on one of (1) a second wire bonding system that is different than the first wire bonding system, or (2) the first wire bonding system with at least one wire bonding system variable changed from step (a); and
  (c) adjusting at least one wire bonding process variable, and repeating step (b) with the at least one adjusted wire bonding process variable such that the second wire payout length determined in the repeated step (b) is closer to the first wire payout length than the second wire payout length determined in the initial step (b),
  wherein using the first wire bonding system, step (a) includes: (1) bonding an end of a wire to a bonding location using a bonding tool to form a first bond, raising a bond head with a wire clamp open until the wire clamp is a first distance above a predetermined height such that a length of wire pays out still connected to the first bond, closing the wire clamp, raising the bond head further such that the wire tears, and determining a second distance that the wire clamp is above the predetermined height when the wire tears; (2) bonding another end of the wire to another bonding location using the bonding tool to form another first bond, performing predetermined looping motions with the wire clamp open and raising the bond head until the wire clamp is at the first distance above the predetermined height, closing the wire clamp, raising the bond head further such that the wire tears, and determining a third distance that the wire clamp is above the predetermined height when the wire tears; and (3) determining the first wire payout length, whereby the first wire payout length is the difference between the third distance and the second distance.

13. The method of claim 12 wherein, using the second wire bonding system, or using the first wire bonding system with the at least one wire bonding system variable changed, step (b) includes:
  (1) bonding an end of a wire to a bonding location using a bonding tool to form a first bond, raising a bond head with a wire clamp open until the wire clamp is a first distance above the predetermined height such that a length of wire pays out still connected to the first bond, closing the wire clamp, raising the bond head further such that the wire tears, and determining a second distance that the wire clamp is above the predetermined height when the wire tears;
  (2) bonding another end of the wire to another bonding location using the bonding tool to form another first bond, performing predetermined looping motions with the wire clamp open and raising the bond head until the wire clamp is at the first distance above the predetermined height, closing the wire clamp, raising the bond head further such that the wire tears, and determining a third distance that the wire clamp is above the predetermined height when the wire tears; and
  (3) determining the second wire payout length, whereby the second wire payout length is the difference between the third distance and the second distance.

14. The method of claim 12 wherein step (b) includes determining the second wire payout length related to the predetermined wire looping motions used in forming the second wire loop, the predetermined looping motions used during step (b) being performed on the first wire bonding system with at least one wire bonding system variable changed during formation of the second wire loop, the at least one wire bonding system variable being changed including at least one of a changed bonding tool type, a changed wire type, a change in the direction of forming the wire loop, a change in a wire feed system, and a change in a wire tensioner system.

15. The method of claim 12 wherein at least one of step (a) and step (b) includes a step of compensating for an elongation of the wire used in the formation of the wire loop in the determination of the respective one of the first wire payout length and the second wire payout length.

16. The method of claim 12 wherein step (c) of adjusting at least one wire bonding process variable includes varying at least one of an air guide setting and a wire tensioner setting.

17. The method of claim 12 wherein step (b) includes determining the second wire payout length related to the predetermined wire looping motions used in the formation of the wire loop, the predetermined looping motions used during step (b) being performed on the first wire bonding system with at least one wire bonding system variable changed during formation of the second wire loop, the at least one wire bonding system variable being changed including a changed bonding tool type.

18. The method of claim 12 wherein step (b) includes determining the second wire payout length related to the predetermined wire looping motions used in the formation of the wire loop, the predetermined looping motions used during step (b) being performed on the first wire bonding system with at least one wire bonding system variable changed during formation of the second wire loop, the at least one wire bonding system variable being changed including a changed wire type.

19. The method of claim 12 wherein step (b) includes determining the second wire payout length related to the predetermined wire looping motions used in the formation of the wire loop, the predetermined looping motions used during step (b) being performed on the first wire bonding system with at least one wire bonding system variable changed during formation of the second wire loop, the at least one wire bonding system variable being changed including a change in a direction of forming a wire loop.

20. The method of claim 12 wherein step (b) includes determining the second wire payout length related to the predetermined wire looping motions used in the formation of the wire loop, the predetermined looping motions used during step (b) being performed on the first wire bonding system with at least one wire bonding system variable changed during formation of the second wire loop, the at least one wire bonding system variable being changed including a change in a wire feed system.

21. The method of claim 12 wherein step (b) includes determining the second wire payout length related to the predetermined wire looping motions used in the formation of the wire loop, the predetermined looping motions used during step (b) being performed on the first wire bonding system with at least one wire bonding system variable changed during formation of the second wire loop, the at least one wire bonding system variable being changed including a change in a wire tensioner system.

22. A method of calibrating a wire payout related to predetermined looping motions used during formation of a wire loop, the wire loop being formed by a wire bonding system including a bond head, the bond head including a wire clamp and a bonding tool, the method comprising the steps of:
   (a) determining a first wire payout length related to predetermined wire looping motions used in forming a first wire loop, the predetermined looping motions being performed on a first wire bonding system;
   (b) determining a second wire payout length related to the predetermined wire looping motions used in forming a second wire loop, the predetermined looping motions used during step (b) being performed on one of (1) a second wire bonding system that is different than the first wire bonding system, or (2) the first wire bonding system with at least one wire bonding system variable changed from step (a); and
   (c) adjusting at least one wire bonding process variable, and repeating step (b) with the at least one adjusted wire bonding process variable such that the second wire payout length determined in the repeated step (b) is closer to the first wire payout length than the second wire payout length determined in the initial step (b),
wherein, using the second wire bonding system, or using the first wire bonding system with the at least one wire bonding system variable changed, step (b) includes: (1) bonding an end of a wire to a bonding location using a bonding tool to form a first bond, raising a bond head with a wire clamp open until the wire clamp is a first distance above a predetermined height such that a length of wire pays out still connected to the first bond, closing the wire clamp, raising the bond head further such that the wire tears, and determining a second distance that the wire clamp is above the predetermined height when the wire tears; (2) bonding another end of the wire to another bonding location using the bonding tool to form another first bond, performing predetermined looping motions with the wire clamp open and raising the bond head until the wire clamp is at the first distance above the predetermined height, closing the wire clamp, raising the bond head further such that the wire tears, and determining a third distance that the wire clamp is above the predetermined height when the wire tears; and (3) determining the second wire payout length, whereby the second wire payout length is the difference between the third distance and the second distance.

\* \* \* \* \*